(12) United States Patent
Nekozuka

(10) Patent No.: US 10,715,189 B2
(45) Date of Patent: Jul. 14, 2020

(54) ELECTRONIC DEVICE

(71) Applicant: KYOCERA Corporation, Kyoto (JP)

(72) Inventor: Hikaru Nekozuka, Yokohama (JP)

(73) Assignee: KYOCERA Corporation, Kyoto (JP)

( * ) Notice: Subject to any disclaimer, the term of this patent is extended or adjusted under 35 U.S.C. 154(b) by 142 days.

(21) Appl. No.: 16/082,218

(22) PCT Filed: Feb. 24, 2017

(86) PCT No.: PCT/JP2017/007218
§ 371 (c)(1),
(2) Date: Sep. 4, 2018

(87) PCT Pub. No.: WO2017/154621
PCT Pub. Date: Sep. 14, 2017

(65) Prior Publication Data
US 2020/0153463 A1 May 14, 2020

(30) Foreign Application Priority Data
Mar. 9, 2016 (JP) ................................ 2016-046203

(51) Int. Cl.
*H04B 1/034* (2006.01)
*H03F 3/45* (2006.01)
*H04B 13/00* (2006.01)

(52) U.S. Cl.
CPC ....... *H04B 1/0343* (2013.01); *H03F 3/45475* (2013.01); *H04B 13/005* (2013.01)

(58) Field of Classification Search
CPC .. H04B 1/0343; H04B 13/005; H03F 3/45475

USPC ......................................................... 455/100
See application file for complete search history.

(56) References Cited

U.S. PATENT DOCUMENTS

| | | | |
|---|---|---|---|
| 7,809,331 B2 | 10/2010 | Kano | |
| 9,485,034 B2* | 11/2016 | Bolin | H04B 13/005 |
| 9,641,261 B2* | 5/2017 | Ying | G06F 1/163 |
| 9,819,075 B2* | 11/2017 | Kerselaers | H04B 5/02 |
| 9,819,395 B2* | 11/2017 | Kerselaers | H04R 25/55 |

(Continued)

FOREIGN PATENT DOCUMENTS

| | | |
|---|---|---|
| JP | 2007020124 A | 1/2007 |
| JP | 2008-027219 A | 2/2008 |

(Continued)

*Primary Examiner* — Sonny Trinh
(74) *Attorney, Agent, or Firm* — Studebaker & Brackett PC (57) ABSTRACT

An electronic device is configured to perform electric field communication via an electric field transmission medium. The electronic device includes a housing. The electronic device also includes a first electrode portion for electric field communication including a first electrode and a second electrode, a second electrode portion for electric field communication including a third electrode and a fourth electrode, and a differential amplifier. The second electrode is disposed further in a direction towards the inside of the housing than the first electrode. The fourth electrode is disposed further in a direction towards the inside of the housing than the third electrode. The first electrode and the second electrode are connected to a first input terminal of the differential amplifier. The second electrode and the fourth electrode are connected to a second input terminal of the differential amplifier.

14 Claims, 11 Drawing Sheets

(56) References Cited

U.S. PATENT DOCUMENTS

| | | | | |
|---|---|---|---|---|
| 10,117,050 | B2 * | 10/2018 | Dobyns | G06Q 30/0261 |
| 10,432,322 | B2 * | 10/2019 | Fukuda | H04B 13/005 |
| 10,515,239 | B2 * | 12/2019 | Washiro | H04B 13/00 |
| 2009/0149212 | A1 | 6/2009 | Kano | |
| 2014/0213184 | A1 | 7/2014 | Matsubara | |

FOREIGN PATENT DOCUMENTS

| | | |
|---|---|---|
| JP | 2010-062818 A | 3/2010 |
| JP | 2010-062820 A | 3/2010 |
| JP | 2010-062850 A | 3/2010 |
| JP | 2010-074606 A | 4/2010 |
| JP | 2013135358 A | 7/2013 |
| JP | 2014-204293 A | 10/2014 |
| WO | 2006/054706 A1 | 5/2006 |
| WO | 2014/030317 A1 | 2/2014 |

* cited by examiner

ELECTRONIC DEVICE

CROSS-REFERENCE TO RELATED APPLICATION

This application claims priority to and the benefit of Japanese Patent Application No. 2016-046203 filed Mar. 9, 2016, the entire contents of which are incorporated herein by reference.

TECHNICAL FIELD

The present disclosure relates to an electronic device that performs electric field communication via an electric field transmission medium.

BACKGROUND

An electric field communication technology, in which an electric field is induced in an electric field transmission medium such as a human body or other conductor and data communication is performed using the electric field, has been proposed. In order to improve the transmission and reception performance of the electrodes used for the electric field communication, various ideas have been introduced.

SUMMARY

An electronic device according to a first embodiment of the present disclosure is configured to perform electric field communication via an electric field transmission medium. The electronic device includes a housing. The electronic device also includes a first electrode portion for electric field communication including a first electrode and a second electrode, a second electrode portion for electric field communication including a third electrode and a fourth electrode, and a differential amplifier. The second electrode is disposed further in a direction towards the inside of the housing than the first electrode. The fourth electrode is disposed further in a direction towards the inside of the housing than the third electrode. The first electrode and the third electrode are connected to a first input terminal of the differential amplifier. The second electrode and the fourth electrode are connected to a second input terminal of the differential amplifier.

An electronic device according to a second embodiment of the present disclosure is configured to perform electric field communication via an electric field transmission medium. The electronic device includes a housing. The electronic device also includes a first electrode portion for electric field communication including a first electrode and a second electrode, a second electrode portion for electric field communication including a third electrode and a fourth electrode, a first differential amplifier, and a second differential amplifier. The second electrode is disposed further in a direction towards the inside of the housing than the first electrode. The fourth electrode is disposed further in a direction towards the inside of the housing than the third electrode. An output of the first electrode portion for electric field communication is inputted to the first differential amplifier. An output of the second electrode portion for electric field communication is inputted to the second differential amplifier.

DETAILED DESCRIPTION

With the conventional electrode arrangement, stable electric field communication may be difficult in some cases. An electronic device of the present disclosure enables stable electric field communication.

Hereinafter, a plurality of embodiments will be described in detail with reference to the accompanying drawings.

Embodiment 1

Figures 1A, 1B:
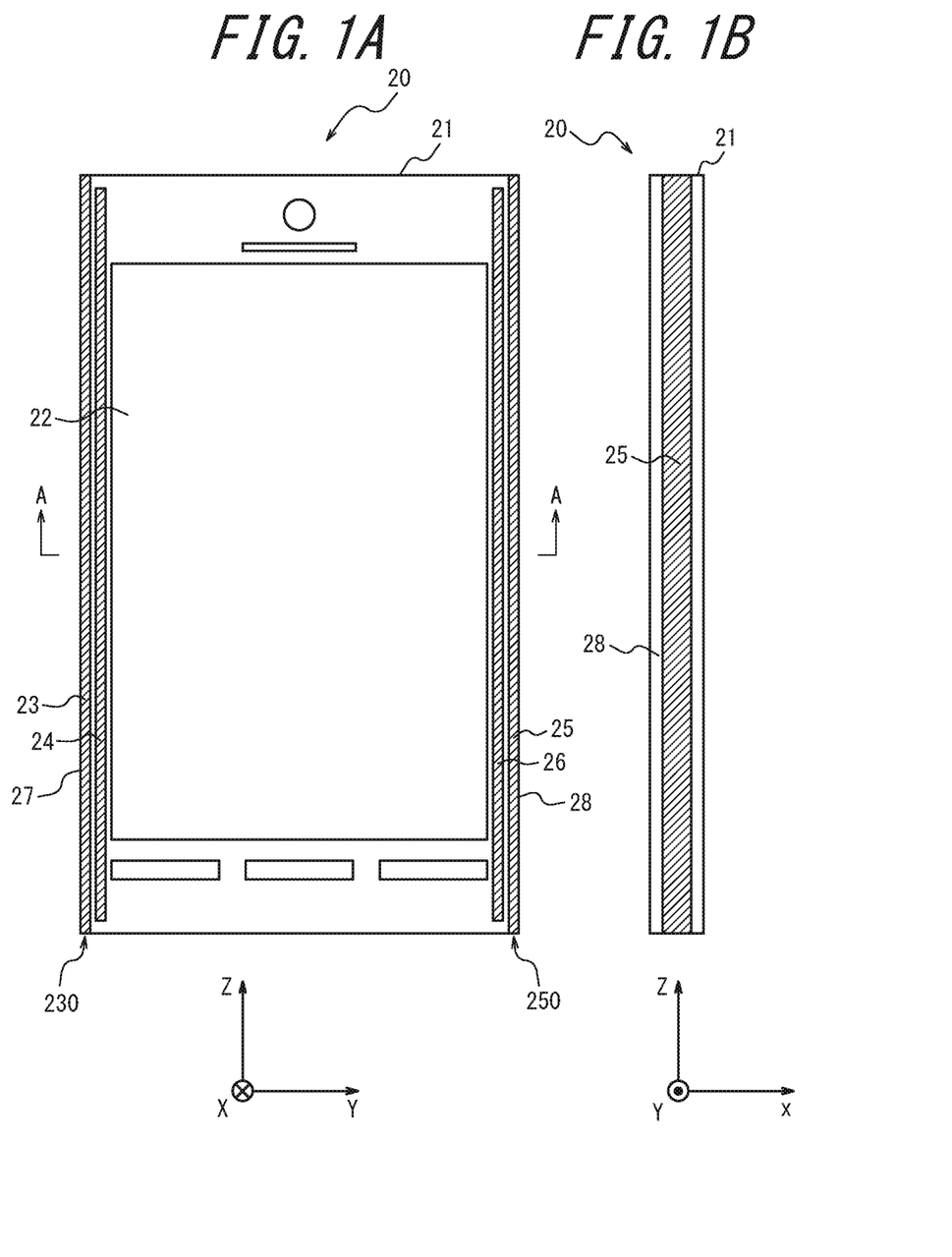
FIGS. 1A and 1B are schematic diagrams illustrating a mobile information terminal according to one embodiment of the present disclosure.
Figure 2:
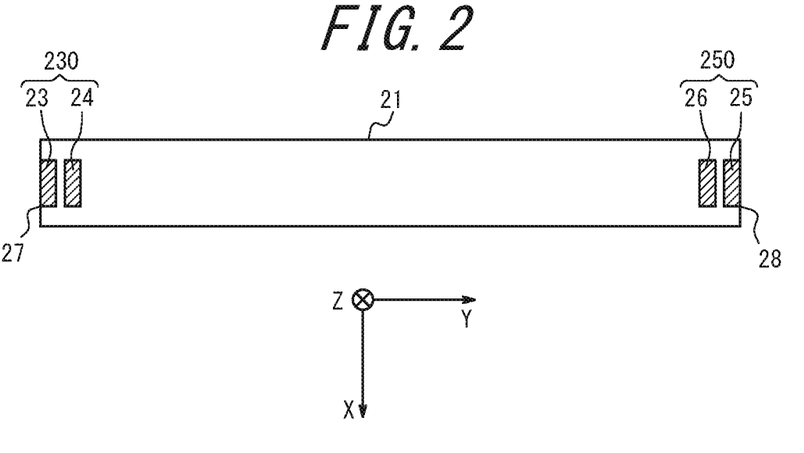
FIG. 2 is a cross-sectional view taken from line A-A in FIG. 1A.

FIGS. 1A and 1B are schematic diagrams illustrating an electronic device according to one embodiment of the present disclosure. FIG. 1A is a front view of the electronic device, and FIG. 1B is a side view of the electronic device. FIG. 2 is a cross-sectional view taken from line A-A in FIG. 1A.

The electronic device illustrated in FIGS. 1A and 1B is a mobile information terminal 20 such as a smartphone, and has a display panel 22 with a rectangular shape made of, for example, liquid crystal, provided on the front surface of a housing 21 with a rectangular shape. A first electrode 23, a second electrode 24, a third electrode 25 and a fourth electrode 26 respectively having a flat plate shape are disposed outside or inside the housing 21. Hereinafter, the first electrode 23, the second electrode 24, the third electrode 25 and the fourth electrode 26 are also simply referred to as the electrode 23, the electrode 24, the electrode 25 and the electrode 26, respectively. The electrodes 23 and 25 are symmetrically disposed at the side surfaces 27 and 28 of the mobile information terminal 20. As illustrated in FIG. 2, the electrode 24 is disposed inside the electrode 23 with respect to the side surface 27 of the housing 21. Similarly, the electrode 26 is disposed inside the electrode 25 with respect to the side surface 28 of the housing 21.

The electrodes 23 and 24 constitute a first electrode portion 230 for electric field communication composed of parallel plate electrodes. The electrodes 25 and 26 constitute a second electrode portion 250 for electric field communication composed of parallel plate electrodes. That is, the electrodes 23 and 24 are parallel to each other along the thickness direction (X axis direction in FIG. 2) and the height direction (Z axis direction in FIG. 2) of the mobile information terminal 20, and constitute a condenser. The electrodes 25 and 26 are parallel to each other along the X axis direction and the Z axis direction of the mobile information terminal 20, and constitute a condenser. For convenience, the set of the electrodes 23 and 24 is referred to as the first electrode portion 230 for electric field communication, and the set of the electrodes 25 and 26 is referred to as the second electrode portion 250 for electric field communication. However, the present disclosure is not limited to this, and each designation may be exchanged.

The outer electrode 23 is disposed so as to be in contact with or in proximity to the user's hand. The inner electrode 24 is disposed at the inner side of the housing 21 so as not to have the same potential as that of the electrode 23 even while the user holds the housing 21. The outer electrode 25 is disposed so as to be in contact with or in proximity to the user's hand. The inner electrode 26 is disposed at the inner side of the housing 21 so as not to have the same potential as that of the electrode 25 even while the user holds the housing 21. In this way, by further providing the electrodes 24 and 26 further inside the housing than the outer electrodes 23 and 25, it is possible to avoid the formation of a closed loop which will be described later.

The outer electrodes 23 and 25 may be disposed on the outer surface of the housing 21 so as to be directly touched by the user's hand, or may be disposed inside the housing 21. In the latter case, it is necessary that the electrodes 23 and 25 are disposed close to the outer surfaces of the housing so as to be able to capacitively couple with the electric field around the human body.

The first electrode portion 230 for electric field communication and the second electrode portion 250 for electric field communication have been described as being disposed symmetrically inside the housing 21. However, the present disclosure is not limited to this, and for example, the distances respectively from the side surface 27 and the side surface 28 may be different. There is no need that both of them are disposed along the side surfaces 27 or 28. For example, the second electrode portion 250 for electric field communication may be disposed along the rear surface of the housing 21. When the mobile information terminal 20 is kept in a pocket of clothes or the like, the rear surface is usually closer to the human body than the side surfaces 27 and 28. Therefore, by disposing the second electrode portion 250 for electric field communication in the above described manner, the sensitivity of electric field communication can be improved. The second electrode portion 250 for electric field communication may be disposed on the front surface of the housing 21 thus to combine the uses of the display panel 22 and the outer electrode 25.

For example, an electrode portion for electric field communication may be provided in a margin part or the like other than the display panel 22 on the front surface of the housing 21. That is, among the front surface of the housing 21, an electrode portion for electric field communication may be provided in a part other than the part in which the display panel 22 is disposed. As described above, an electrode portion for electric field communication is not limited to be disposed at the side surfaces 27 and 28, and may be disposed along any surface of the housing 21. For example, when electrode portions for electric field communication are formed at the lower corners among the four corners of the housing of an electronic device such as a smartphone, since the lower part of the four corners is more likely to be touched by the user's hand, electric field communication can be performed more stably. Here, the lower corners among the four corners of the housing mean the corners of the housing at the lower side of the display screen of the electronic device.

The electrodes may, for example, be formed using a conductive metal film formed by vapor deposition or the like. In this case, the thickness of each electrode is in the order of a micrometer. The outer electrodes 23 and 25 may be combined with the metal design of the housing 21. The inner electrodes 24 and 26 may be constituted by wiring of a printed board or a flexible printed board.

In order to perform electric field communication by capacitively coupling with the electric field around the human body, as the area of each electrode constituting each electrode portion for electric field communication is larger, or as the distance between the electrodes is shorter, namely, as the capacity of the condenser is larger, the sensitivity is better. In each set of the electrodes 23 and 24 and the electrodes 25 and 26, the electrodes have the same size or shape. However, the present disclosure is not limited to this, and the electrodes may have different sizes or shapes.

Figure 3:
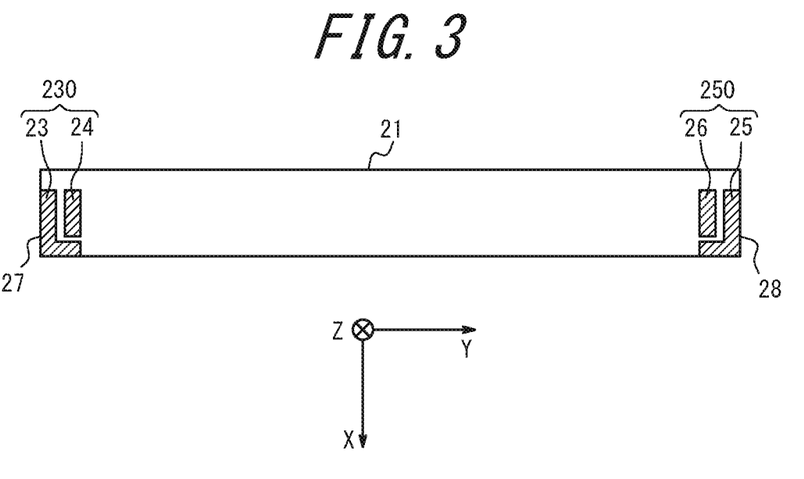
FIG. 3 is a cross-sectional view illustrating a variation of the embodiment according to the present disclosure.

For example, the electrodes have been described as having a flat plate shape. However, as illustrated in FIG. 3, the outer electrodes 23 and 25 may be arranged with an L shape along two outer surfaces of a side surface and the rear surface that are adjacent to each other. On the other hand, the inner electrode 24 may have a flat plate shape or an L shape, and is disposed so as to form a condenser with the electrode 23. Similarly, the inner electrode 26 may have a flat plate shape or an L shape, and is disposed so as to form a condenser with the electrode 25. FIG. 3 illustrates an example in which the electrodes 24 and 26 are of a flat plate shape.

When the user grips the mobile information terminal 20 such as a smartphone, the palm of the hand or the fingertips contact the two corners formed by the side surfaces 27 and 28 and the rear surface of the housing 21. Therefore, by arranging the outer electrodes 23 and 25 with an L shape, the sensitivity of electric field communication is improved according to the use mode of the mobile information terminal 20.

As described above, the combination of the outer electrode 23 that is easily touched by the human body and the inner electrode 24 that avoids the contact with the human body constitutes the first electrode portion 230 for electric field communication. Similarly, the combination of the outer electrode 25 that is easily touched by the human body and the inner electrode 26 that avoids the contact with the human body constitutes the second electrode portion 250 for electric field communication. With such a configuration, it is possible to avoid the formation of a closed loop which will be described later. That is, regardless of how the user holds or carries the electronic device, a potential difference, namely, an electric field, would be generated between the electrodes. As a result, the mobile information terminal 20 according to the present embodiment is capable of performing stable electric field communication, irrespective of whether the part held by the user's hand is biased toward any one or both of the first electrode portion 230 for electric field communication and the second electrode portion 250 for electric field communication.

Configuration examples of an electric field communication unit included in the mobile information terminal 20 according to the present embodiment will be described.

Figure 4:
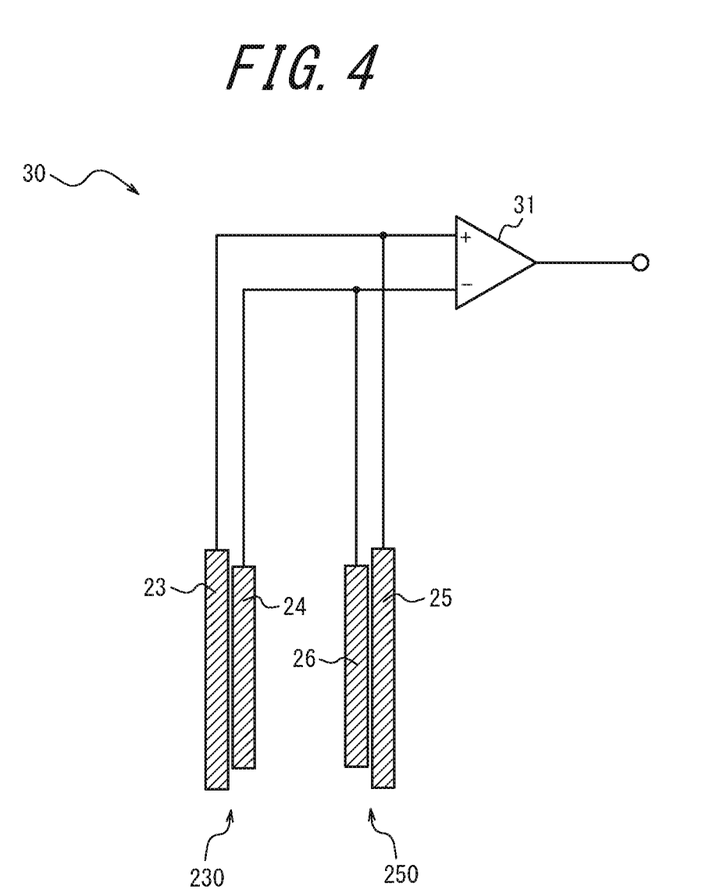
FIG. 4 is a block diagram illustrating a first configuration example of an electric field communication unit included in the mobile information terminal of FIG. 1.

FIG. 4 is a block diagram illustrating an electric field communication unit 30 according to a first configuration example. The electric field communication unit 30 includes the outer electrodes 23 and 25, the inner electrodes 24 and 26, and a differential amplifier 31. The electrodes 23 and 25 are connected to a first input terminal of the differential amplifier 31. The electrodes 24 and 26 are connected to a second input terminal of the differential amplifier 31. In FIG. 4, for example, the first input terminal is a non-inverting input terminal. The second input terminal is an inverting input terminal. However, the present disclosure is not limited to this, and each designation may be exchanged.

During electric field communication, at least one of the first electrode portion 230 for electric field communication consisting of the electrodes 23 and 24, and the second electrode portion 250 for electric field communication consisting of the electrodes 25 and 26 is configured to, for example, receive signals via an electric field transmission medium such as the human body. The received signals are then inputted to the differential amplifier 31, after the outputs of the outer electrodes 23 and 25 and the outputs of the inner electrodes 24 and 26 are respectively added. Since the received signals are extremely weak, differential amplification is also performed to improve sensitivity.

In the electric field communication unit 30, since the outputs of the outer electrodes 23 and 25 are added, the area of the outer electrodes can effectively be regarded as the addition of the areas of the electrodes 23 and 25 Similarly, since the outputs of the inner electrodes 24 and 26 are added, the area of the inner electrodes can be effectively regarded as the addition of the areas of the electrodes 24 and 26. As a result, the areas of the outer and inner electrodes are effectively increased. By increasing the areas of the electrodes, the sensitivity is improved. In addition, by performing differential amplification, the sensitivity of electric field communication is further improved.

Figure 5:
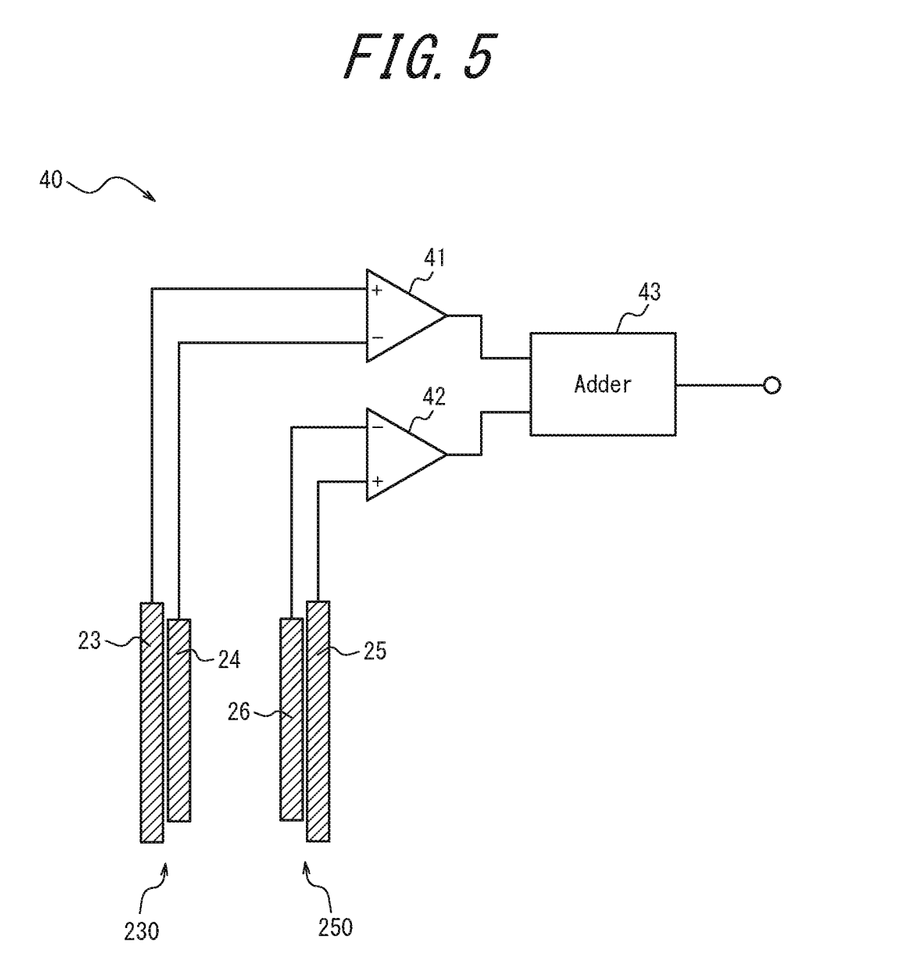
FIG. 5 is a block diagram illustrating a second configuration example of the electric field communication unit included in the mobile information terminal of FIG. 1.

FIG. 5 is a block diagram illustrating an electric field communication unit 40 according to a second configuration example. The electric field communication unit 40 includes the outer electrodes 23 and 25, the inner electrodes 24 and 26, two differential amplifiers 41 and 42, and an adder 43. The output of the electrode portion 230 for electric field communication consisting of the electrodes 23 and 24 is configured to be inputted to the first differential amplifier 41. The output of the second electrode portion 250 for electric field communication consisting of the electrodes 25 and 26 is configured to be inputted to the second differential amplifier 42. The outputs differentially amplified respectively by the differential amplifiers 41 and 42 are then inputted to the adder 43, and each output voltage is respectively added.

In FIG. 5, for example, the outer electrode 23 is connected to the non-inverting input terminal of the differential amplifier 41, and the inner electrode 24 is connected to the inverting input terminal. However, the present disclosure is not limited to this, and each designation may be exchanged.

The outer electrode 25 is connected to the non-inverting input terminal of the differential amplifier 42, and the inner electrode 26 is connected to the inverting input terminal. However, the present disclosure is not limited to this, and each designation may be exchanged.

During electric field communication, at least one of the first electrode portion 230 for electric field communication consisting of the electrodes 23 and 24, and the second electrode portion 250 for electric field communication consisting of the electrodes 25 and 26 is configured to, for example, receive signals via an electric field transmission medium such as the human body. Signals received by the first electrode portion 230 for electric field communication are configured to be differentially amplified by the first differential amplifier 41. Similarly, signals received by the second electrode portion 250 for electric field communication are configured to be differentially amplified by the second differential amplifier 42. Since the received signals are extremely weak, differential amplification is also performed to improve sensitivity. After differentially amplifying the received signals, the adder 43 adds the outputs obtained by the differential amplification.

In the electric field communication unit 40, since the outputs of the first electrode portion 230 for electric field communication and the second electrode portion 250 for electric field communication are respectively differentially amplified by the first differential amplifier 41 and the second differential amplifier 42, the sensitivity of electric field communication is significantly improved. Moreover, since the outputs obtained by the differential amplification are added by the adder 43, the potential is increased, and thus the sensitivity of electric field communication is further improved.

Figure 6:
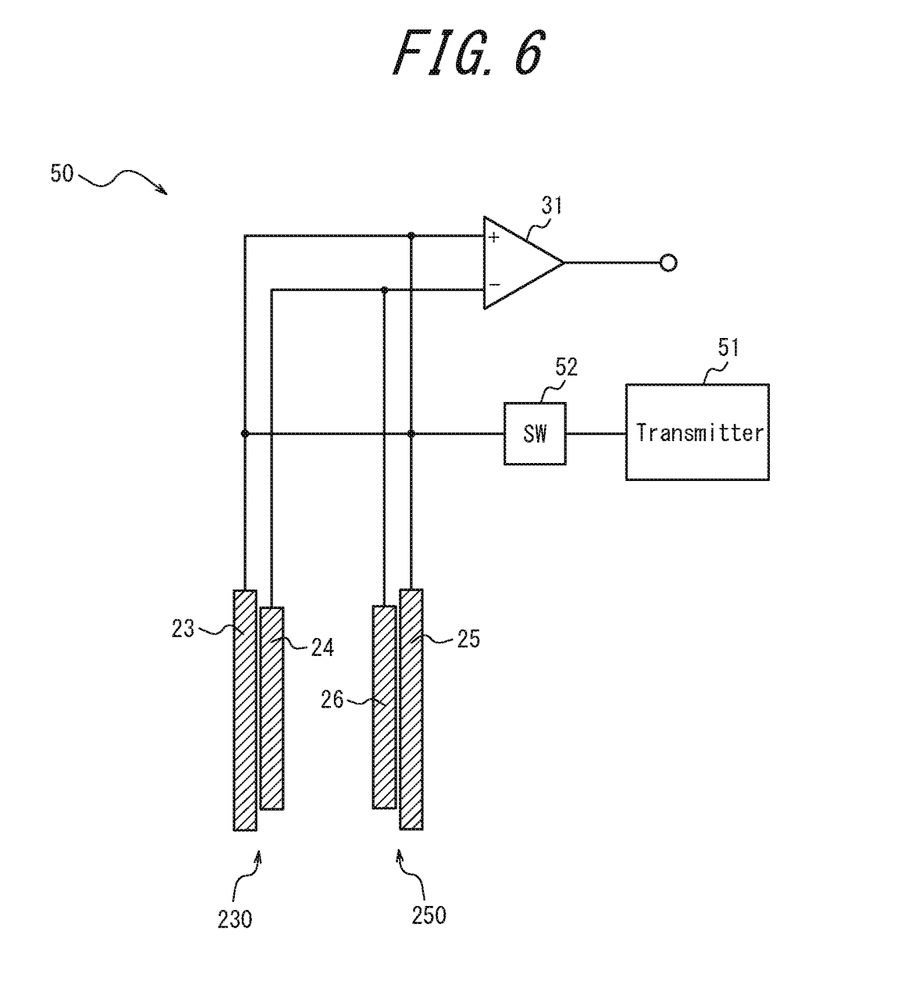
FIG. 6 is a block diagram illustrating a third configuration example of the electric field communication unit included in the mobile information terminal of FIG. 1.

FIG. 6 is a block diagram illustrating an electric field communication unit 50 according to a third configuration example. The electric field communication unit 50 is obtained by adding a transmission system to the electric field communication unit 30 illustrated in FIG. 4. With regard to the reception system, since it is exactly the same as that of the electric field communication unit 30 illustrated in FIG. 4, the description thereof will be omitted and the points different from those of the electric field communication unit 30 will be mainly described.

The electric field communication unit 50 further includes a transmitter 51 configured to transmit signals for electric field communication, and a switch 52 configured to switch reception or transmission of electric field communication. The transmitter 51 is connected to the electrode 23 and the electrode 25 via the switch 52.

With such a configuration, the electric field communication unit 50 can switch to either reception or transmission of electric field communication. As a specific example of reception, for example, the mobile information terminal 20 can also automatically acquire the information related to the health condition of the user acquired by wearable equipment by electric field communication while in a clothing pocket. On the other hand, as a specific example of transmission, for example, when passing through a ticket machine at a station, ID information stored in the mobile information terminal 20 is transmitted to a fixed terminal device for electric field communication. The fixed terminal device recognizes the ID information, and the user is able to pass through the ticket machine with the mobile information terminal kept in the clothing pocket.

Figure 7:
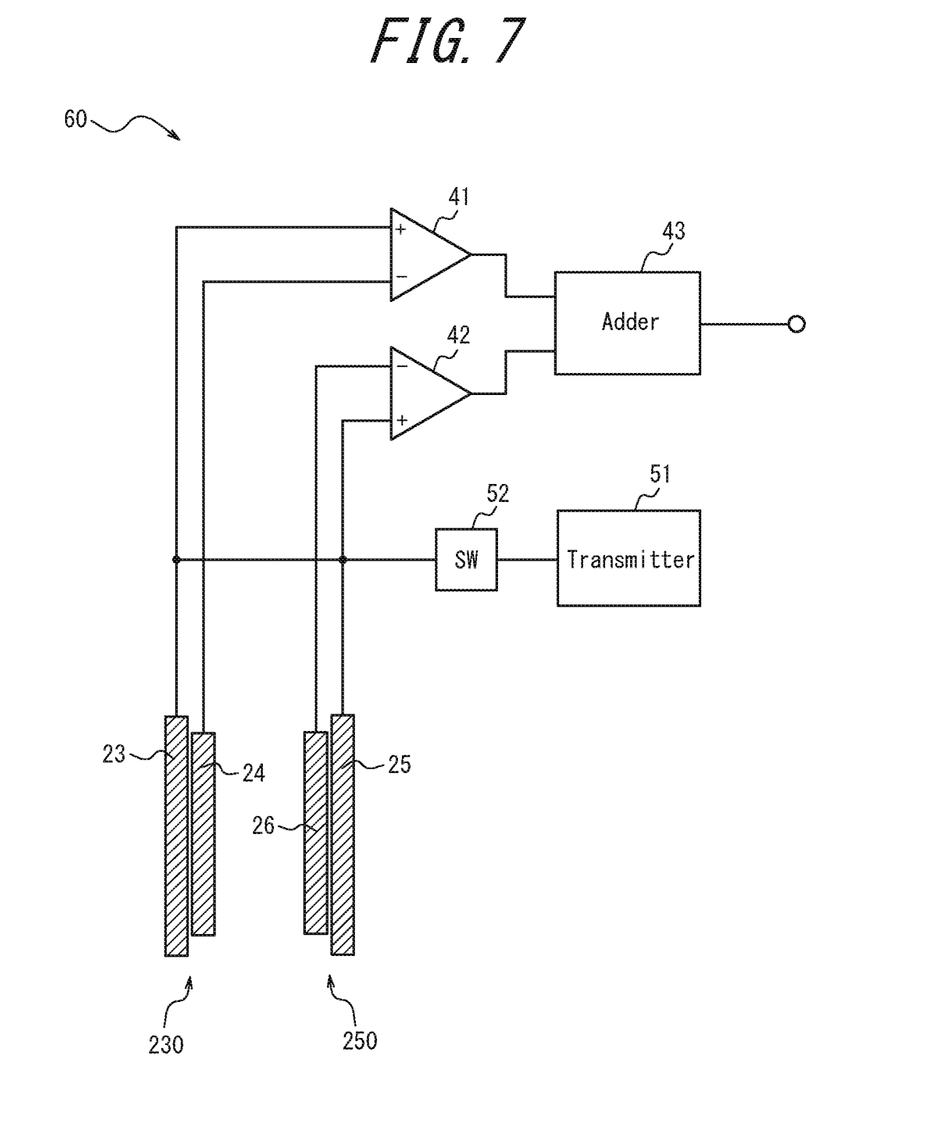
FIG. 7 is a block diagram illustrating a fourth configuration example of the electric field communication unit included in the mobile information terminal of FIG. 1.

FIG. 7 is a block diagram illustrating an electric field communication unit 60 according to a fourth configuration example. The electric field communication unit 60 is obtained by adding a transmission system to the electric field communication unit 40 illustrated in FIG. 5. With regard to the reception system, since it is exactly the same as that of the electric field communication unit 40 illustrated in FIG. 5, the description thereof will be omitted and the points different from those of the electric field communication unit 40 will be mainly described.

The electric field communication unit 60 further includes a transmitter 51 configured to transmit signals for electric field communication, and a switch 52 configured to switch reception or transmission of electric field communication. The output terminal of the transmitter 51 is connected to the electrode 23 and the electrode 25 via the switch 52.

With such a configuration, the electric field communication unit 60 can switch to either reception or transmission of electric field communication. Accordingly, similarly to the case of FIG. 6, for example, the mobile information terminal 20 can also automatically acquire the information related to the health condition of the user acquired by wearable equipment while in a clothing pocket. Also, the user is able to pass through a ticket machine with the mobile information terminal 20 kept in the clothing pocket.

Embodiment 2

Figure 8:
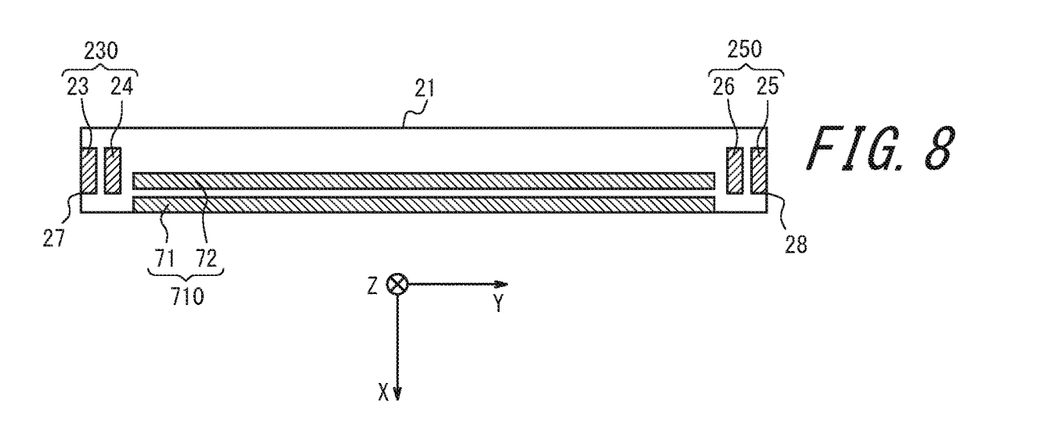
FIG. 8 is a cross-sectional view illustrating the configuration of a main part of a mobile information terminal according to another embodiment of the present disclosure.

FIG. 8 is a cross-sectional view illustrating the configuration of a main part of an electronic device according to another embodiment of the present disclosure. The electronic device according to the present embodiment is obtained by adding an electrode portion 710 for electric field communication to the mobile information terminal 20 described in Embodiment 1.

The third electrode portion 710 for electric field communication consists of, for example, a fifth electrode 71 disposed at the outer side and a sixth electrode 72 disposed at the inner side, at the rear side of the housing 21. Hereinafter, the fifth electrode 71 and the sixth electrode 72 are also referred to as the electrode 71 and the electrode 72. The variation examples related to the arrangement, configuration, size and shape of the electrodes described in Embodiment 1 are applied as they are also in the case of Embodiment 2.

Configuration examples of an electric field communication unit included in the mobile information terminal 20 according to Embodiment 2 will be described.

Figure 9:
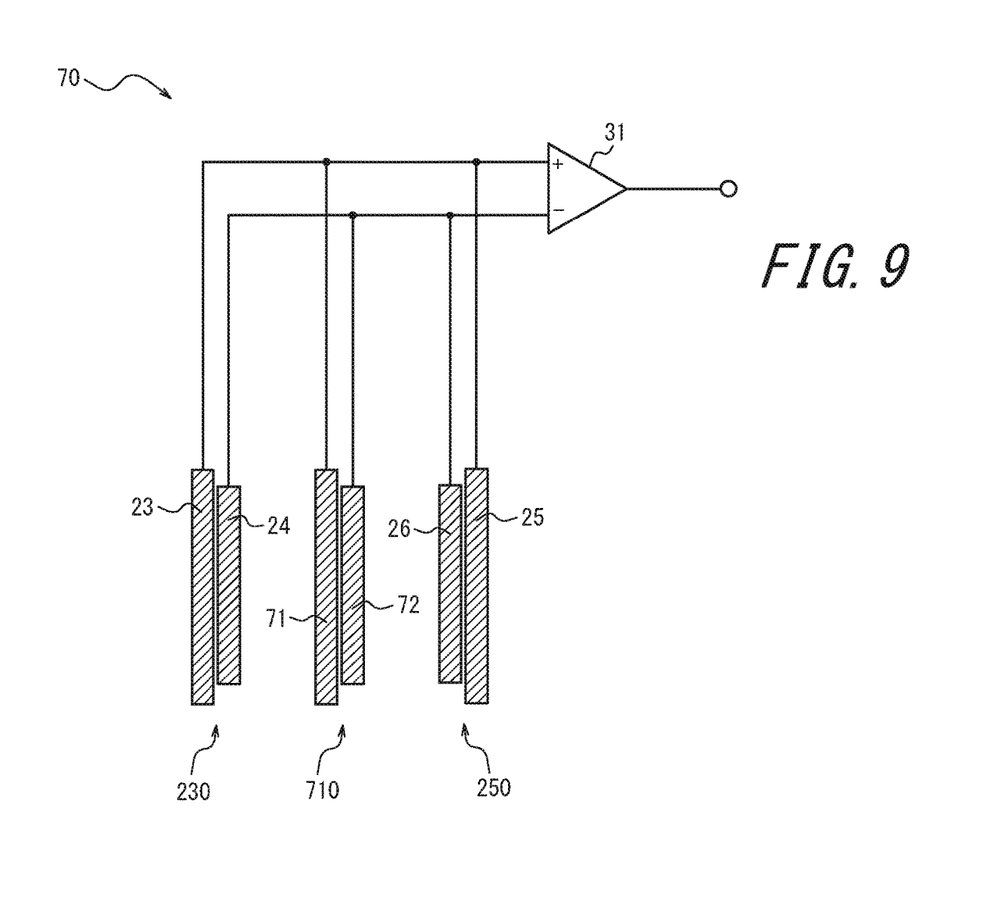
FIG. 9 is a block diagram illustrating a first configuration example of an electric field communication unit included in the mobile information terminal of FIG. 8.

FIG. 9 is a block diagram illustrating an electric field communication unit 70 according to a first configuration example. The electric field communication unit 70 is obtained by respectively connecting the electrode 71 and the electrode 72 constituting the third electrode portion 710 for electric field communication to the first input terminal and the second input terminal of the differential amplifier 31 in the electric field communication unit 30 illustrated in FIG. 4.

During electric field communication, at least one of the first electrode portion 230 for electric field communication, the second electrode portion 250 for electric field communication, and the third electrode portion 710 for electric field communication is configured to, for example, receive signals via an electric field transmission medium such as the human body. The received signals are then inputted to the differential amplifier 31, after the outputs of the outer electrodes 23, 25 and 71 and the outputs of the inner electrodes 24, 26 and 72 are respectively added. Since the received signals are extremely weak, differential amplification is also performed to improve sensitivity.

In the electric field communication unit 70, since the outputs of the outer electrodes 23, 25 and 71 are added, the area of the outer electrodes is effectively regarded as the addition of the areas of the electrodes 23, 25 and 71. Similarly, since the outputs of the inner electrodes 24, 26 and 72 are added, the area of the inner electrodes is effectively regarded as the addition of the areas of the electrodes 24, 26 and 72. As a result, the areas of the outer and inner electrodes are further increased compared to the case of the electric field communication unit 30 illustrated in FIG. 4. By increasing the areas of the electrodes, the sensitivity is further improved. In addition, by performing differential amplification, the sensitivity of electric field communication is further improved.

Figure 10:
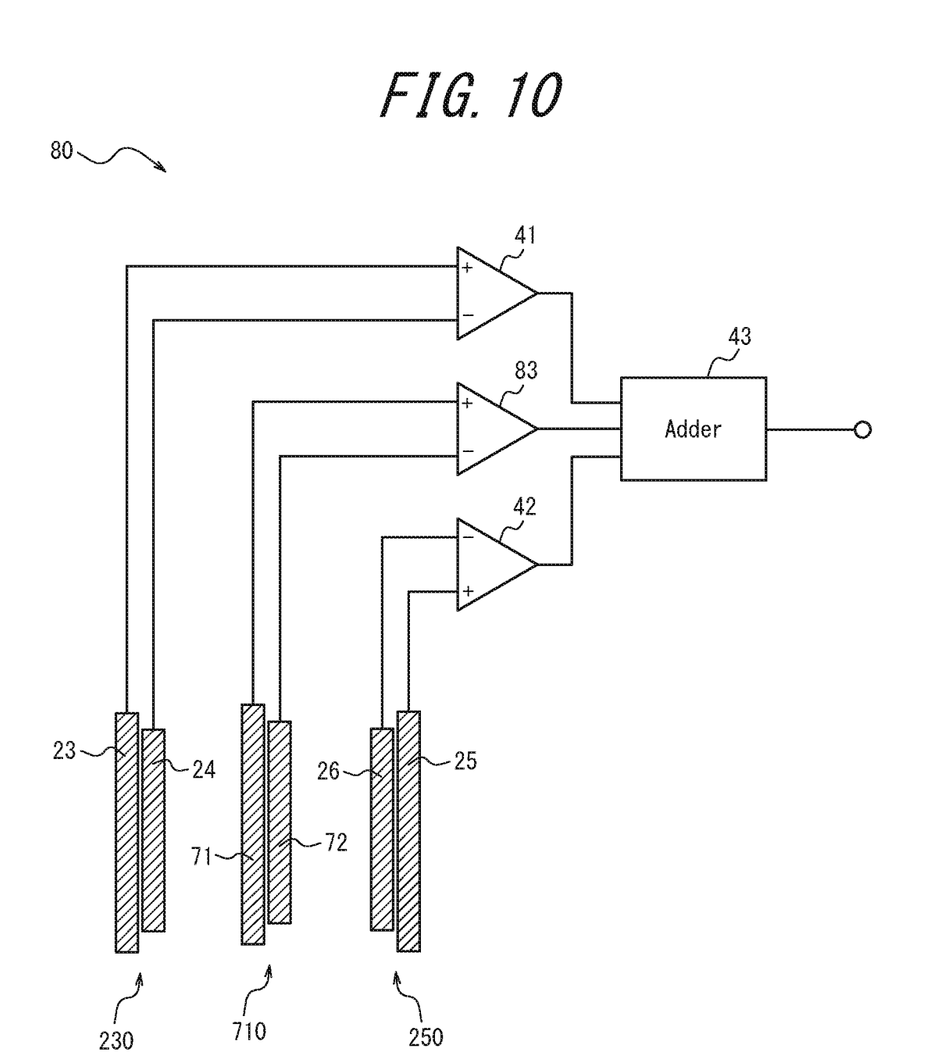
FIG. 10 is a block diagram illustrating a second configuration example of the electric field communication unit included in the mobile information terminal of FIG. 8.

FIG. 10 is a diagram illustrating an electric field communication unit 80 according to a second configuration example. The electric field communication unit 80 is obtained by adding a third differential amplifier 83 to the electric field communication unit 40 illustrated in FIG. 5. The output of the third electrode portion 710 for electric field communication consisting of the electrodes 71 and 72 is configured to be inputted to the third differential amplifier 83. The outputs differentially amplified respectively by the differential amplifiers 41, 42 and 83 are inputted to the adder 43, and each output voltage is respectively added.

In FIG. 10, for example, the outer electrode 71 is connected to the non-inverting input terminal of the third differential amplifier 83, and the inner electrode 72 is connected to the inverting input terminal. However, the present disclosure is not limited to this, and each designation may be exchanged.

During electric field communication, at least one of the first electrode portion 230 for electric field communication, the second electrode portion 250 for electric field communication, and the third electrode portion 710 for electric field communication is configured to, for example, receive signals via an electric field transmission medium such as the human body. Signals received by the first electrode portion 230 for electric field communication are configured to be differentially amplified by the first differential amplifier 41. Signals received by the second electrode portion 250 for electric field communication are configured to be differentially amplified by the second differential amplifier 42. Signals received by the third electrode portion 710 for electric field communication are configured to be differentially amplified by the third differential amplifier 83. Since the received signals are extremely weak, differential amplification is also respectively performed to improve sensitivity. After differentially amplifying the received signals, the outputs obtained by the differential amplification are added by the adder 43.

In the electric field communication unit 80, the outputs of the first electrode portion 230 for electric field communication, the second electrode portion 250 for electric field communication, and the third electrode portion 710 for electric field communication are respectively differentially amplified by the first differential amplifier 41, the second differential amplifier 42, and the third differential amplifier 83. Therefore, the sensitivity of electric field communication is further improved compared to the case of the electric field communication unit 40 illustrated in FIG. 5. In addition, since the outputs obtained by the differential amplification are added by the adder 43, the potential is increased, and thus the sensitivity of electric field communication is further improved.

Figure 11:
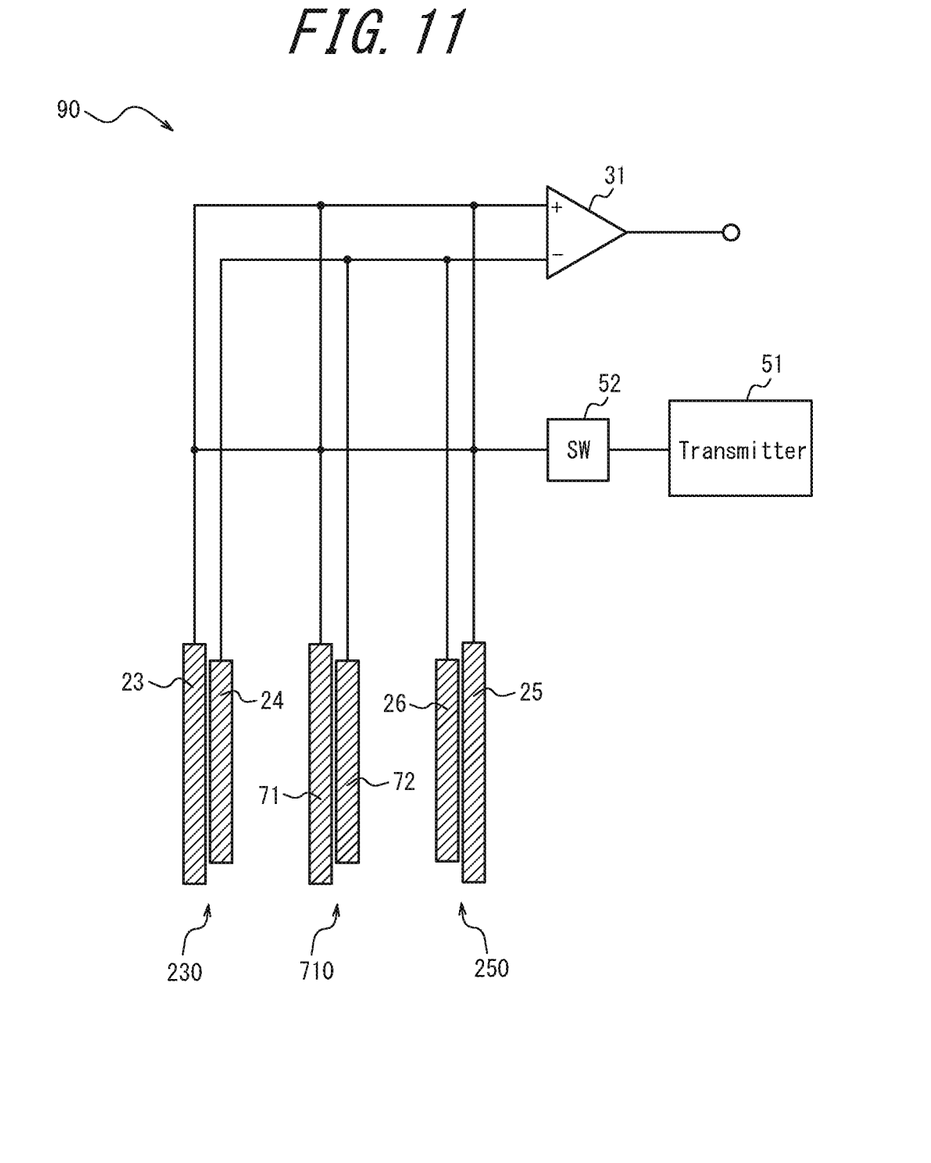
FIG. 11 is a block diagram illustrating a third configuration example of the electric field communication unit included in the mobile information terminal of FIG. 8.

FIG. 11 is a block diagram illustrating an electric field communication unit 90 according to a third configuration example. The electric field communication unit 90 is obtained by adding the transmission system including the transmitter 51 and the switch 52 illustrated in FIG. 6 to the electric field communication unit 70 illustrated in FIG. 9, and connecting the output terminal of the transmitter 51 to the electrodes 23, 25 and 71 via the switch 52.

With such a configuration, similarly to the electric field communication unit 50 illustrated in FIG. 6, the electric field communication 70 illustrated in FIG. 9, and connecting the output terminal of the transmitter 51 to the electrodes 23, 25 and 71 via the switch 52. Provided with the third electrode portion 710 for electric field communication, the areas of the outer and inner electrodes are further increased compared to those of the electric field communication unit 50. By increasing the areas of the electrodes, the reception sensitivity is further improved. Similarly, the transmission strength of signals for electric field communication is further improved. That is, the electric field communication unit 90 further improves the performance of electric field communication.

Figure 12:
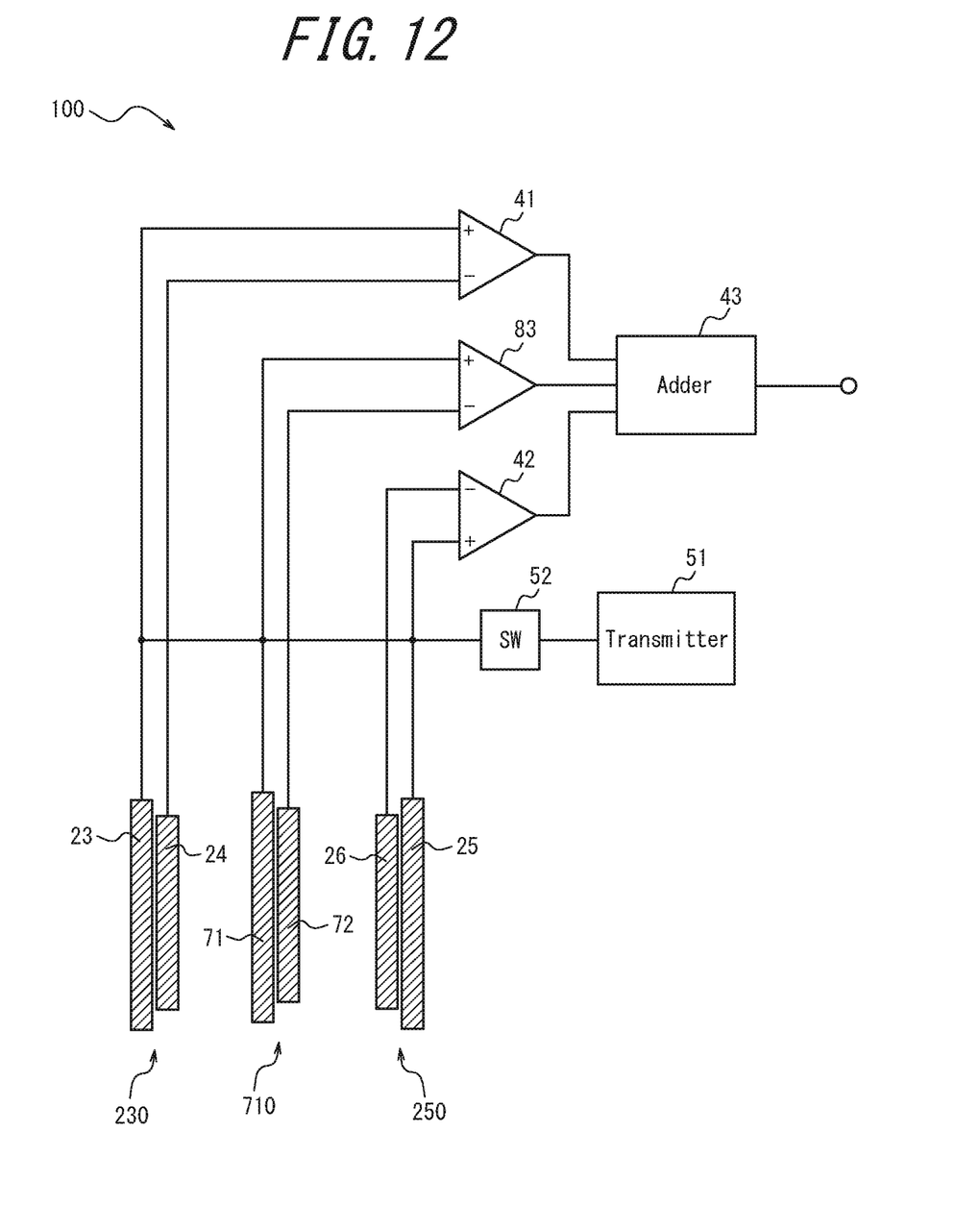
FIG. 12 is a block diagram illustrating a fourth configuration example of the electric field communication unit included in the mobile information terminal of FIG. 8.

FIG. 12 is a block diagram illustrating an electric field communication unit 100 according to a fourth configuration example. The electric field communication unit 100 is obtained by adding the transmission system including the transmitter 51 and the switch 52 illustrated in FIG. 6 to the electric field communication unit 80 illustrated in FIG. 10, and connecting the output terminal of the transmitter 51 to the electrode 23, the electrode 25 and the electrode 71 via the switch 52.

With such a configuration, similarly to the electric field communication unit 60 illustrated in FIG. 7, the electric field communication unit 100 can switch to either reception or transmission of electric field communication. In the electric field communication unit 100, the outputs of the first electrode portion 230 for electric field communication, the second electrode portion 250 for electric field communication, and the third electrode portion 710 for electric field communication are respectively differentially amplified by the first differential amplifier 41, the second differential amplifier 42, and the third differential amplifier 83. Therefore, the reception sensitivity of electric field communication is further improved compared to the case of the electric field communication unit 60. By adding the third electrode portion 710 for electric field communication, the transmission strength of signals for electric field communication is further improved. That is, the electric field communication unit 100 further improves the performance of electric field communication.

Figures 13A, 13B:
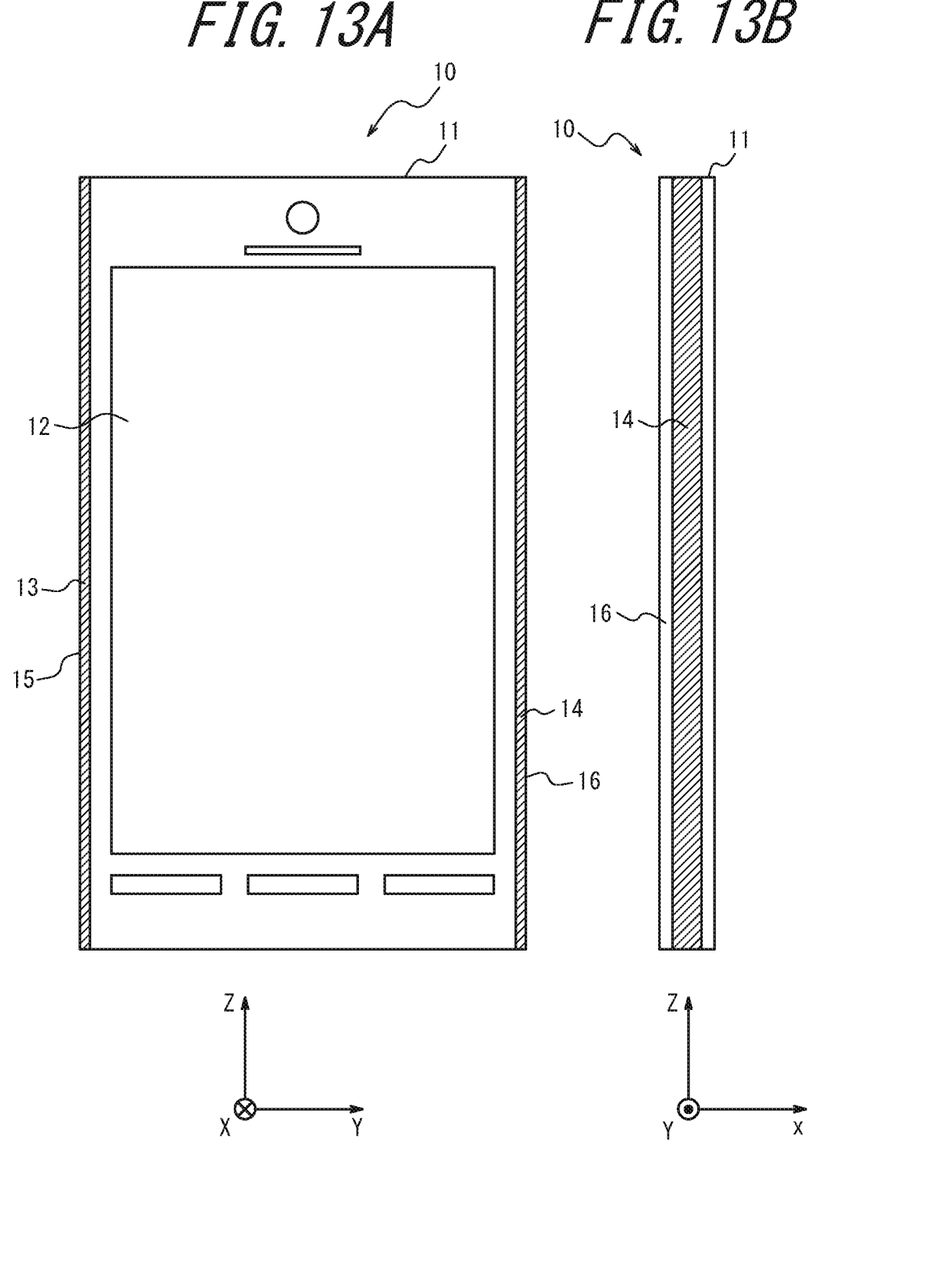
FIGS. 13A and 13B are schematic diagrams illustrating an electronic device as a base technology.

Here, for comparison with the present disclosure described above, a technology as a premise of the present disclosure will be described with reference to the drawings. FIGS. 13A and 13B are schematic diagrams illustrating an electronic device as a base technology. FIG. 13A is a front view of the electronic device, and FIG. 13B is a side view of the electronic device.

The electronic device illustrated in FIGS. 13A and 13B, for example, is a mobile information terminal 10, such as a smartphone, and has a display panel 12 with a rectangular shape made of, for example, liquid crystal, provided on the front surface of a housing 11 with a rectangular shape. Two electrodes 13 and 14 with a flat plate shape are disposed outside or inside the housing 11. The electrodes 13 and 14 are symmetrically disposed at side surfaces 15 and 16 of the mobile information terminal 10 that face each other so as to form parallel plate electrodes. More particularly, the electrodes 13 and 14 are parallel to each other along the thickness direction (X axis direction in FIGS. 13A and 13B) and the height direction (Z axis direction in FIGS. 13A and 13B) of the mobile information terminal 10. That is, the electrodes 13 and 14 form a condenser.

As described above, in FIGS. 13A and 13B, the two electrodes 13 and 14 are disposed symmetrically outside or inside the mobile information terminal 10 so as to form parallel plate electrodes. In the conventional electrode arrangement, a configuration of two sets of parallel plate electrodes using four electrodes that are respectively parallel along the display panel. Also in this case, each of the two sets of parallel plate electrodes is such that, the electrodes are symmetrically disposed inside the mobile information terminal at the front surface side and the rear surface side of the housing that face each other.

In a normal use state of the mobile information terminal 10 such as a smartphone, the user grips the housing 11 with the hand. At this time, it is usual for the user to contact both of the side surfaces 15 and 16 with the hand and grip the housing 11 in a manner to support it. As a result, a closed loop is formed by the act of gripping the housing 11 with the hand, and the electrodes 13 and 14 are likely to become the same potential. When there is no potential difference between the electrodes 13 and 14, no electric field would be generated, and thus electric field communication cannot be performed.

As described above, in the mobile information terminal 10 of FIG. 13, depending on how it is held, the potential difference between the electrodes 13 and 14 may become zero, and electric field communication may become unstable. In order to solve such a problem, in the embodiments of the present disclosure described above, two electrodes are further added at the inner side with respect to the outer surface of the housing 11.

The differential amplifier, the adder and the like according to another embodiment may be configured as an integrated circuit. In the above described embodiments, a differential amplifier circuit is used as a differential amplifier. However, in addition to a differential amplifier circuit, an inverting amplifier circuit, a non-inverting amplifier circuit or the like may be used. A differential amplifier circuit is resistant to noise and is suitable for amplifying minute signals.

It would be apparent to those skilled in the art that the present disclosure can be realized in other predetermined forms other than the above described embodiments without departing from the spirit or essential features thereof. Therefore, the above description only includes some of the examples, and embodiments of the present disclosure shall not be limited thereto. The scope of the present disclosure is defined by the appended claims rather than the above description. Among any changes, several changes within the equivalent scope shall be included therein. For example, in the above embodiments, description has been made with respect to the cases of having two and three electrode portions for electric field communication, however, the present disclosure is not limited thereto, and the electronic device may have four or more electrode portions for electric field communication. The electronic device may perform diversity control by, for example, selecting the one having the largest output or selecting the one with the smallest noise among the outputs from a plurality of electrode portions for electric field communication.

In the above embodiments, each electrode portion for electric field communication has been described as for performing electric field communication, however, the present disclosure is not limited thereto, and each electrode may be used for myoelectric potential measurement, electrocardiogram measurement, electroencephalogram measurement or the like. When measuring myoelectric potential and electrocardiogram, the user shall previously bring the mobile information terminal 20 into contact with the optimal position of the human body. When measuring electroencephalogram, the mobile information terminal 20 shall be, for example, a glasses type wearable device or a head mounted display (HMD). Each electrode may be disposed at the frame portion of the glasses or the head portion of the HMD. In this way, the mobile information terminal 20 can be applied as a sensor as well as for electric field communication.

REFERENCE SIGNS LIST

20 Mobile information terminal (electronic device)
21 Housing
22 Display panel
23, 24, 25, 26, 71, 72 Electrode
27, 28 Side surface
30, 40, 50, 60, 70, 80, 90, 100 Electric field communication unit
31, 41, 42, 83 Differential amplifier
43 Adder
51 Transmitter
52 Switch
230, 250, 710 Electric portion for electrode field communication

The invention claimed is:

1. An electronic device that performs electric field communication via an electric field transmission medium, comprising:
a housing;
a first electrode portion for electric field communication including a first electrode and a second electrode;
a second electrode portion for electric field communication including a third electrode and a fourth electrode; and
a differential amplifier; wherein
the second electrode is disposed further in a direction towards the inside of the housing than the first electrode;
the fourth electrode is disposed further in a direction towards the inside of the housing than the third electrode;
the first electrode and the third electrode are connected to a first input terminal of the differential amplifier; and
the second electrode and the fourth electrode are connected to a second input terminal of the differential amplifier.

2. The electronic device according to claim 1, further comprising:
a transmitter configured to transmit a signal for electric field communication; and
a switch configured to switch reception or transmission of electric field communication; wherein
an output terminal of the transmitter is connected to the first electrode and the third electrode via the switch.

3. The electronic device according to claim 1, further comprising:
a third electrode portion for electric field communication including a fifth electrode and a sixth electrode; wherein
the sixth electrode is disposed further in a direction towards the inside of the housing than the fifth electrode; and
the fifth electrode is connected to the first input terminal of the differential amplifier; and
the sixth electrode is connected to the second input terminal of the differential amplifier.

4. The electronic device according to claim 3, further comprising:
a transmitter configured to transmit a signal for electric field communication; and
a switch configured to switch reception or transmission of electric field communication; wherein
an output terminal of the transmitter is connected to the first electrode, the third electrode and the fifth electrode via the switch.

5. The electronic device according to claim 1, wherein
each set of the electrodes constituting each of the electrode portions for electric field communication includes parallel plate electrodes.

6. The electronic device according to claim 1, wherein
among the electrodes constituting each of the electrode portions for electric field communication, the electrode disposed in an outer direction of the housing is disposed along two adjacent outer surfaces of the housing.

7. An electronic device that performs electric field communication via an electric field transmission medium, comprising:
a housing;
a first electrode portion for electric field communication including a first electrode and a second electrode;
a second electrode portion for electric field communication including a third electrode and a fourth electrode;
a first differential amplifier; and
a second differential amplifier; wherein
the second electrode is disposed further in a direction towards the inside of the housing than the first electrode;
the fourth electrode is disposed further in a direction towards the inside of the housing than the third electrode;
an output of the first electrode portion for electric field communication is inputted to the first differential amplifier; and
an output of the second electrode portion for electric field communication is inputted to the second differential amplifier.

8. The electronic device according to claim 7, further comprising:
a transmitter configured to transmit a signal for electric field communication; and
a switch configured to switch reception or transmission of electric field communication; wherein
an output terminal of the transmitter is connected to the first electrode and the third electrode via the switch.

9. The electronic device according to claim 7, further comprising:
a third electrode portion for electric field communication including a fifth electrode and a sixth electrode; and
a third differential amplifier; wherein
the sixth electrode is disposed further in a direction towards the inside of the housing than the fifth electrode; and
an output of the third electrode portion for electric field communication is inputted to the third differential amplifier.

10. The electronic device according to claim 9, further comprising:
a transmitter configured to transmit a signal for electric field communication; and
a switch configured to switch reception or transmission of electric field communication; wherein an output terminal of the transmitter is connected to the first electrode, the third electrode and the fifth electrode via the switch.

11. The electronic device according to claim 9, further comprising:
an adder configured to add and output an output of the first differential amplifier, an output of the second differential amplifier and an output of the third differential amplifier.

12. The electronic device according to claim 7, wherein each set of the electrodes constituting each of the electrode portions for electric field communication includes parallel plate electrodes.

13. The electronic device according to claim 7, wherein among the electrodes constituting each of the electrode portions for electric field communication, the electrode disposed in an outer direction of the housing is disposed along two adjacent outer surfaces of the housing.

14. The electronic device according to claim 7, further comprising:
an adder configured to add and output an output of the first differential amplifier and an output of the second differential amplifier.

* * * * *